United States Patent [19]

Betsui

[11] Patent Number: 5,214,289
[45] Date of Patent: May 25, 1993

[54] CHARGED PARTICLE BEAM DEFLECTOR

[75] Inventor: Keiichi Betsui, Kawasaki, Japan

[73] Assignee: Fujitsu Limited, Kawasaki, Japan

[21] Appl. No.: 797,844

[22] Filed: Nov. 26, 1991

[30] Foreign Application Priority Data

Nov. 28, 1990 [JP] Japan .................. 2-327499

[51] Int. Cl.$^5$ .............................. H01J 37/30
[52] U.S. Cl. ................... 250/396 R; 250/398; 250/492.2
[58] Field of Search ........... 250/396 R, 492.2, 492.22, 250/492.23, 398, 396 ML

[56] References Cited

U.S. PATENT DOCUMENTS 4,980,567 12/1990 Yasuda et al. .................. 250/396 R
4,982,099 1/1991 Lischke ........................ 250/396 R

FOREIGN PATENT DOCUMENTS

0289885A1 11/1988 European Pat. Off. .
0335711A2 10/1989 European Pat. Off. .
0344513A2 12/1989 European Pat. Off. .
0457632A2 11/1991 European Pat. Off. .
1-248617 10/1989 Japan .
1-307222 12/1989 Japan .

Primary Examiner—Jack I. Berman
Assistant Examiner—Kiet T. Nguyen
Attorney, Agent, or Firm—Nikaido, Marmelstein, Murray & Oram

[57] ABSTRACT

A charged particle beam deflector has a simple structure for providing a uniform potential distribution over each blanking aperture. The deflector is easy to operate, and stabilizes the shape of a charged particle beam component passing through each blanking aperture even with a low deflection voltage. A pair of deflecting electrodes are arranged on opposing inner walls of each blanking aperture. A voltage applied to the deflecting electrodes is controlled to correctly deflect the charged particle beam component passing through the blanking aperture. A pair of resistance films are arranged on the other opposing inner walls of the blanking aperture, to connect both sides of the deflecting electrodes.

The deflector may employ patterned beam generating apertures. A pair of deflecting electrodes are formed on opposing inner walls of each of the apertures. A voltage applied to the deflecting electrodes is controlled to correctly deflect a charged particle beam component passing through the aperture.

19 Claims, 19 Drawing Sheets

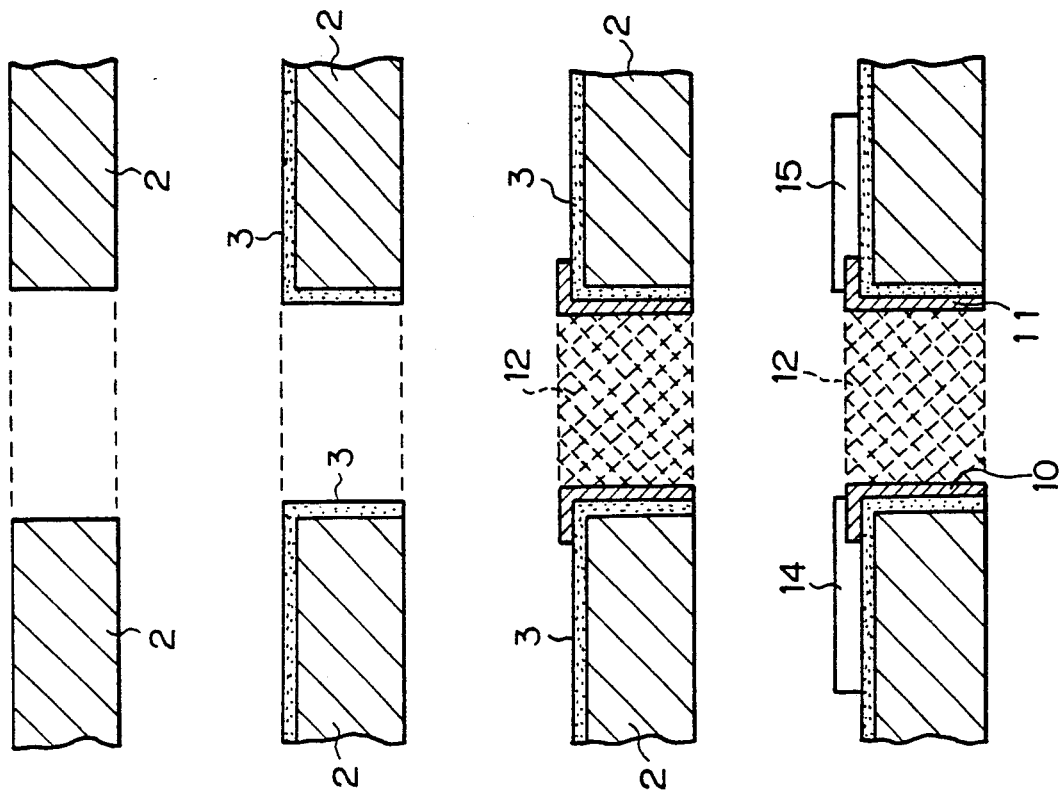

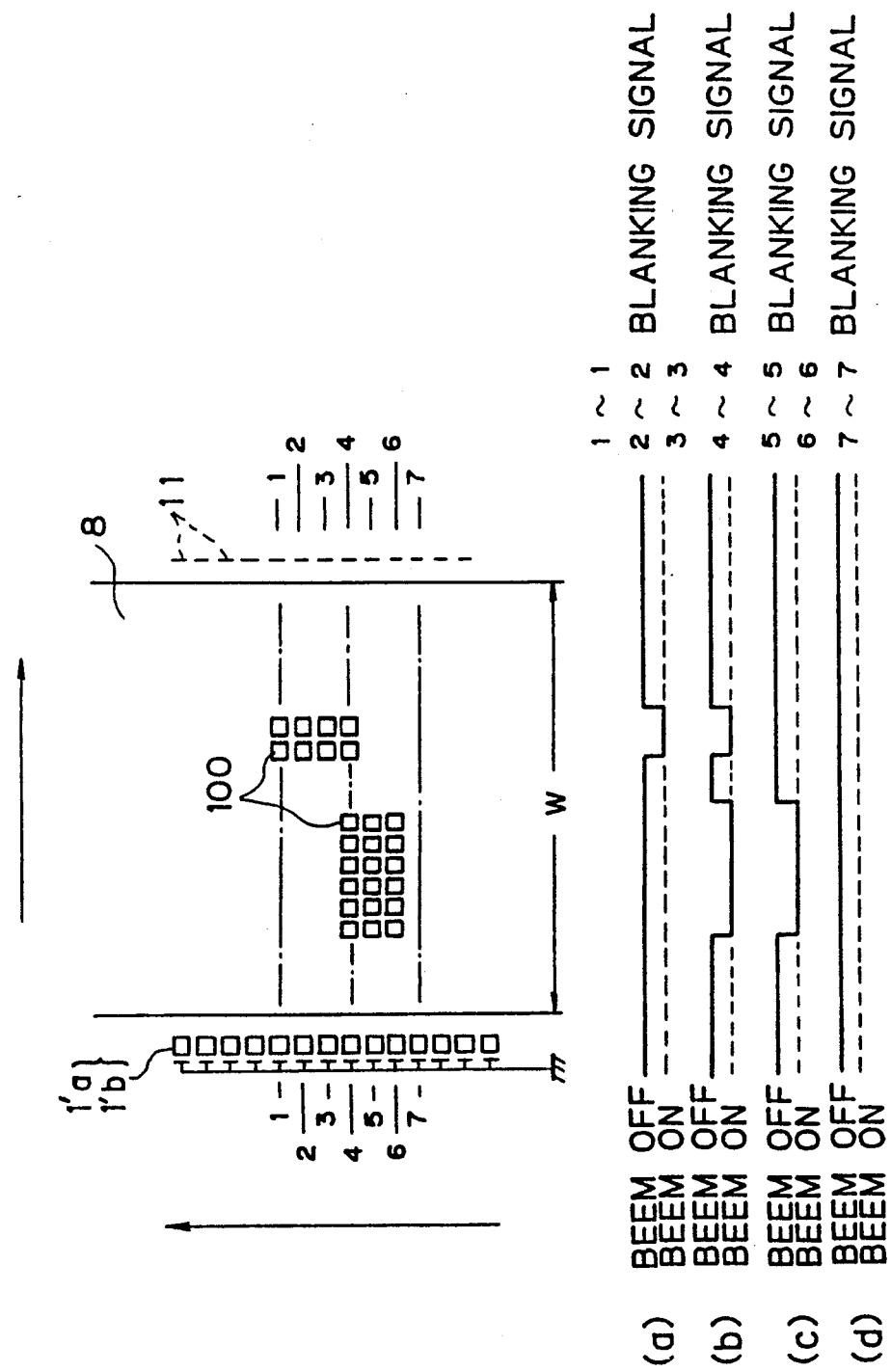

CHARGED PARTICLE BEAM DEFLECTOR

BACKGROUND OF THE INVENTION

1. Field of the Invention

The present invention relates to a charged particle beam deflector, and particularly to an improvement of a blanking aperture used on an electron beam deflector, electron beam exposure apparatus, etc., that is capable of collectively drawing patterns using multiple beams or patterned beams.

2. Description of the Related Art

Electron beam exposure techniques used for manufacturing semiconductor integrated circuits must have a pattern drawing accuracy of submicron order. To draw a pattern at this accuracy, it takes a long time if a very fine variable rectangular beam is employed. To shorten the time, various studies have been made to employ a line beam that realizes a plurality of simultaneous shots.

FIG. 6 is a schematic view showing an example of a charged particle beam deflector used for an electron beam exposure apparatus.

A blanking aperture array 1 includes a plurality of apertures 1'a, 1'b, and so on. Each of the apertures has a pair of blanking electrodes for deflecting (turning on and off) a charged particle beam (an electron beam). An electron gun 42 emits an electron beam, which passes through the blanking apertures 1'a, 1'b, and so on, as well as a main deflector 43 and a subdeflector 44, and draws patterns on a wafer 46 placed on a stage 45.

A CPU 47 provides drawing data stored in a memory 48 to a bit map generator 52, which provides a bit map. According to the bit map, a group of blanking generators 53 control the electrodes of the apertures 1'a, 1'b, and so on to turn on and off components of the beam passing through the apertures, respectively.

A sequence controller 54 receives data from an interface 50 and sequentially controls the bit map generator 52, a blanking controller 55, a deflector controller 56, and a stage controller 57. The blanking controller 55 controls the blanking generators 53, and the deflection controller 56 controls the main deflector 43 and subdeflector 44. The stage controller 57 controls the position of the stage 45 with a step motor 60.

FIGS. 7(A) and 7(B) are views showing an example of a conventional blanking aperture, in which FIG. 7(A) is a top view and FIG. 7(B) a sectional view along a line X—X of FIG. 7(A).

A conductive or semiconductive substrate 2 has an opening of, for example, a square shape. Insulation films 3 are formed on inner walls S and S' of the opening, and deflecting electrodes 10 and 11 are formed on the insulation films 3. Lead metalized pattern 14 and 15 are provided for the deflecting electrodes 10 and 11, respectively. Each of the blanking apertures 1'a, 1'b, and so on of FIG. 6 is formed in this way.

This arrangement is insufficient, even with a predetermined voltage applied to the deflecting electrodes 10 and 11, to deflect and completely move a beam out of an aperture corresponding position on the wafer 46. Namely, the beam may remain on the wafer 46 to blur a pattern drawn on the wafer 46. This problem may be solved by increasing the voltage applied to the deflecting electrodes 10 and 11. This, however, increases costs.

FIGS. 8(A) and 8(B) are views showing an example of a conventional blanking aperture for generating a patterned beam, in which FIG. 8(A) is a top view and FIG. 8(B) a sectional view along a ling X—X of FIG. 8(A).

This blanking aperture is used for repeatedly drawing a relatively large pattern on a wafer. The blanking aperture is made from an aperture board 200 having an aperture 101 for providing a patterned beam, and a deflecting board 201 having substantially the same arrangement as that of the blanking aperture shown in FIGS. 7(A) and 7(B).

In FIGS. 7(A) and 7(B), opposing inner walls L and L' where the deflecting electrodes 10 and 11 do not exist are at a ground potential level. Accordingly, lines H of electric force from one of the deflecting electrodes (for example, 11) are curved to enter the inner walls L and L', thereby reduce the quantity of lines of electric force reaching the electrode 10. As a result, a uniform electric field is not provided. To compensate for this insufficient electric field formed inside the aperture, the deflection voltage must be increased.

In FIGS. 8(A) and 8(B), the aperture board 200 and deflecting board 201 for generating a patterned beam must be separately prepared and combined after axially aligning them. This deteriorates operability.

In recent years, many apertures are prepared and collectively controlled to simultaneously expose many positions of a wafer to expedite the exposing process. For this purpose, a number of blanking apertures are densely arranged (1'a, 1'b, and so on in FIG. 6), sometimes in a plurality of lines. In these cases, the distance between adjacent apertures is very small, so that electric fields generated in the adjacent apertures may interfere with each other to inaccurately deflect components of a beam passing through the apertures.

SUMMARY OF THE INVENTION

To solve the problems of the prior arts, an object of the invention is to provide a charged particle beam deflector comprising a deflecting electrode means (a deflecting electrode 11 and a grounding electrode 10) that is capable of providing as many parallel lines of electric force as possible, to increase the number of lines of electric force reaching the grounding electrode 10 from the deflecting electrode 11.

Another object of the invention is to provide a charged particle beam deflector that effectively prevents electric field interference between densely integrated blanking apertures, thereby accurately and efficiently deflecting a beam.

To achieve the objects, a charged particle beam deflector according to the invention basically comprises an array of blanking apertures arranged in a predetermined shape for passing a charged particle beam, and a deflecting electrode means disposed close to each of the blanking apertures and having a grounding electrode and a deflecting electrode for deflecting a component of the charged particle beam passing through the aperture. The deflector controls a deflection of the charged particle beam by applying a predetermined voltage to the deflecting electrode means. The deflecting electrode and grounding electrode of the deflecting electrode means are arranged opposite each other and separated by a distance corresponding to at least the length of the aperture. A nonconductive member is arranged at least partly in a space formed between sides of the deflecting and grounding electrodes.

According to the prior arts mentioned above, a beam passing through a blanking aperture is deflected by applying a predetermined voltage to the deflecting electrode means disposed at the blanking aperture. At this time, lines of electric force are curved by an electric field generated by the deflecting electrode means toward inner walls of the blanking aperture where the deflecting electrode means (the deflecting electrode 11 and grounding electrode 10) does not exist. The inventors of this invention found that the cause of the curving of the lines of electric force was the electric characteristics of the inner walls of the aperture where the deflecting electrode 11 and grounding electrode 10 did not exist, and that this problem would be solved by changing the electric characteristics of the inner walls.

Namely, the invention provides a charged particle beam deflector comprising an array 1 of blanking apertures $1'a$, $1'b$, and so on each having a square opening OP formed on a semiconductor material; a deflecting electrode means including a deflecting electrode 11 and a grounding electrode 10 disposed in the opening OP; and nonconductive portions formed on inner walls L and L' of the opening OP where the deflecting electrode 11 and grounding electrode 10 do not exist.

The inner walls L and L' may be made of resistance materials, resistance films, insulators, or insulation films, each having a proper resistance value.

Alternatively, the inner walls L and L' may be made of a semiconductor whose conduction type is different from that of the substrate 1.

BRIEF DESCRIPTION OF THE DRAWINGS

FIG. 2(A-D) are a view showing manufacturing processes of the embodiment of FIG. 1;

FIG. 9 is a plan view showing a method of deflecting a line beam, and a time chart of applied voltages;

DESCRIPTION OF THE PREFERRED EMBODIMENTS

Figure 1A:
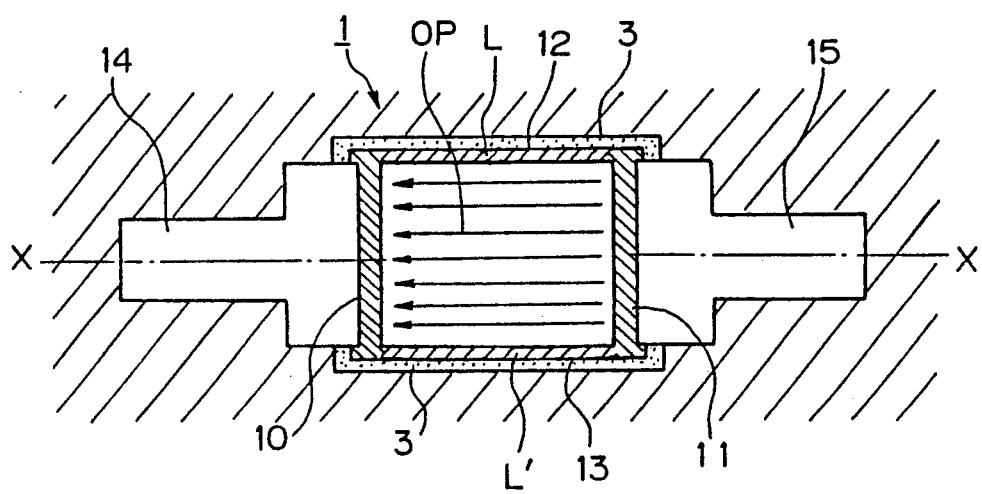
FIG. 1(A-B) are a view showing a first embodiment of the invention.

An embodiment according to a first aspect of the invention will be explained in detail with reference to the drawings.

A charged particle beam deflector according to the first aspect of the invention has a blanking aperture 1. Deflecting electrodes 10 and 11 are arranged on opposing inner walls S1 and S2, respectively, of an opening OP of the blanking aperture 1. By controlling a voltage applied to the deflecting electrodes 10 and 11, a charged particle beam passing through the opening OP is deflected. Resistance films 12 and 13 are arranged on opposing inner walls L and L', respectively, of the opening OP of the blanking aperture 1, and connected to sides of the deflecting electrodes 10 and 11.

An array of the blanking apertures 1 is formed on a semiconductor substrate 2, and at least the inner walls L and L' are covered with insulation films 3.

Alternatively, the blanking apertures 1 are formed on a semiconductor substrate 2, and at least the inner walls are covered with a semiconductor layer 4 whose conduction type is different from that of the substrate 2.

Figure 1B:
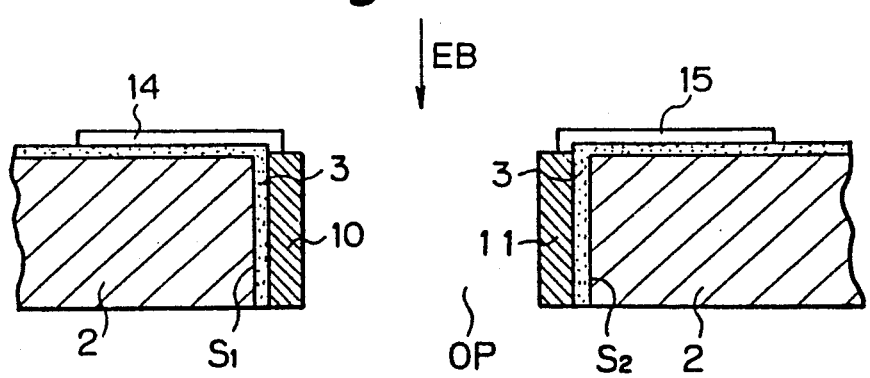

FIGS. 1(A) and 1(B) show a first embodiment of the invention, in which FIG. 1(A) is a top view and FIG. 1(B) a sectional view along a line X—X of FIG. 1(A).

In the figures, a conductive or semiconductive substrate 2 has an opening OP having, for example, a square shape. Opposing inner walls S1 and S2 of the opening OP are provided with insulation films 3 on which deflecting electrodes 10 and 11 are formed. Other opposing inner walls L and L' where the deflecting electrodes 10 and 11 do not exist are provided with the insulation films 3 on which resistance films 12 and 13 are formed. On one face of the substrate 2, lead metallized patterns 14 and 15 for the deflecting electrodes 10 and 11 are formed on the insulation films 3, thereby completing a blanking aperture 1 of the invention.

The deflecting electrodes 10 and 11 and resistance films 12 and 13 may be formed by sputtering the same high melting point metal such as Ta, or different materials.

FIGS. 2(A) to 2(D) are sectional views showing manufacturing processes of the first embodiment of the invention. The processes will be sequentially explained.

Process (1): A semiconductor silicon substrate 2 is prepared. An opening of, for example, 20 μm square is formed on the substrate 2 according to a photolithography technique.

Process (2): A thermal oxide ($SiO_2$) film 3 of, for example, 500 nm thin is formed over the surface and side faces of the opening of the substrate 2.

Process (3): A film of Ta of, for example, 10 nm thin is formed over the side faces of the opening of the substrate 2 according to a sputtering technique. Conductor portions for deflecting electrodes are slightly extended onto the surface of the substrate. This process simultaneously forms deflecting electrodes 10 and 11 and resistance films 12 and 13. As is known, Ta is frequently used as a material for a resistance film.

Process (4): Ta or W is sputtered to form a film for lead conductors 14 and 15 covering the extended portions of the deflecting electrodes 10 and 11 on the surface of the substrate. The film is patterned into a predetermined shape according to a known photolithography technique, to complete a blanking aperture according to the invention.

Figure 3A:
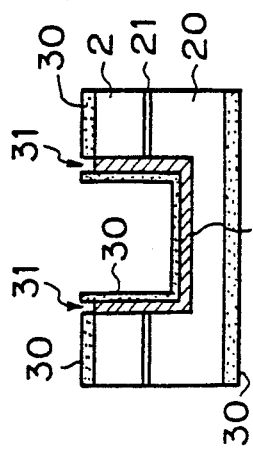
FIG. 3(A-I) are a view showing other manufacturing processes of the embodiment of FIG. 1.
Figure 3B:
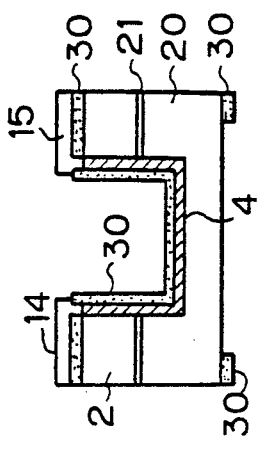
Figure 3C:
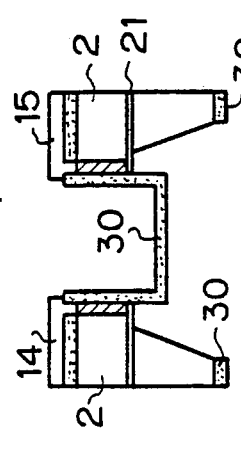
Figure 3D:
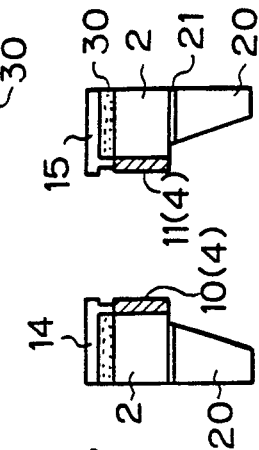
Figure 3E:
Figure 3F:
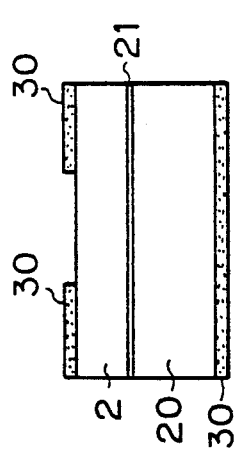
Figure 3G:
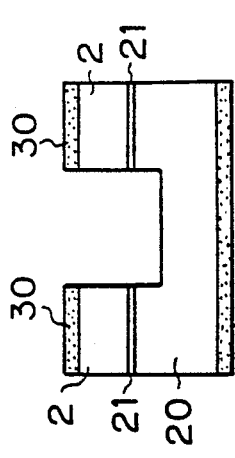
Figure 3H:
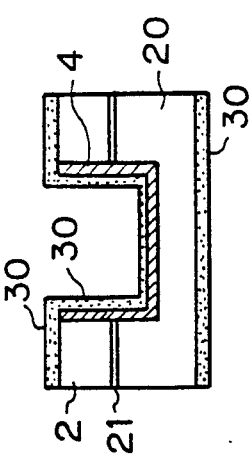
Figure 31:
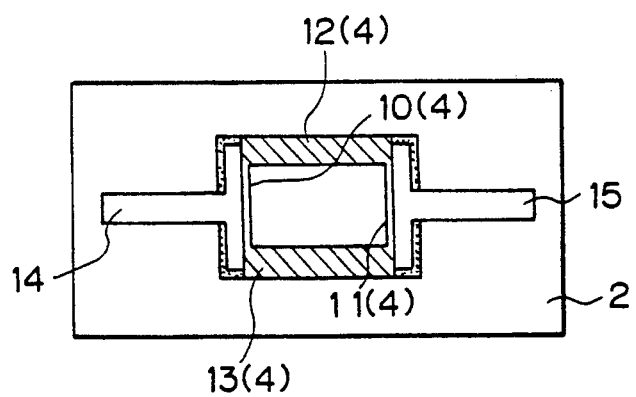

FIGS. 3(A) to 3(I) are views showing other examples of manufacturing processes for the first embodiment of the invention, in which FIGS. 3(A) to 3(H) are sectional views showing the processes and FIG. 3(I) a top view showing a completed product. The processes will be sequentially explained.

Process (1): An n-Si support substrate 20 having a surface orientation of <100> is prepared. An impurity diffusion layer 21 of about 1 μm thin and $10^{20}/cm^3$ in dope concentration of B is formed over the support substrate 20. Over the impurity diffusion layer 21, a p-Si layer of about 10 μm thin doped with B is epitaxially grown according to a CVD method, to form a substrate 2.

Process (2): A thermal oxide ($SiO_2$) film 30 of, for example, 1000 nm thin is formed on each exposed face of the substrates. A window for a trench, e.g., an opening of 20 μm square is formed through the thermal oxide film 30 on the surface of the substrate 2 according to a photolithography technique.

Process (3): A trench of the depth and shape shown in the figure (with the opening of 20 μm square) is formed in the substrates according to, for example, a reactive ion etching technique.

Process (4): P is diffused over inner faces of the opened substrates, to form an n-Si layer 4 of about 500 nm thin. Thermal oxidation is again carried out to form an $SiO_2$ film 30 of about 200 nm thin.

Process (5): A contact hole 31 is formed to reach the n-Si layer 4 through the $SiO_2$ film 30 at a location where a connection to each deflecting electrode is made, according to a photolithography technique using reactive ion etching.

Process (6): Lead metallizations 14 and 15 are formed by sputtering a Ta film to reach the n-Si layer 4 through the contact holes 31 on the substrate. The $SiO_2$ film 30 on the reverse face is removed by reactive ion etching so that the periphery of the support substrate 20 is left.

Process (7): The n-Si support substrate 20 is anisotropically etched from the reverse side into a shape shown in the figure. This anisotropic etching may be easily carried out by using, for example, a mixture of ethylenediamine, pyrocatechol, and water at 117° C. At this time, the n-Si layer 4 is also etched. The B doped impurity diffusion layer 21 having an etching rate of three digits slower than that of the n-Si layer 4 having a surface orientation of <100> is left and exposed under the n-Si layer 4.

Process (8): The $SiO_2$ film 30 remaining on the substrate is dissolved and removed by an HF water solution. The exposed part of the impurity diffusion layer 21 remaining under the n-Si layer 4 is removed by reactive ion etching carried out in mixed gases of $CF_4+O_2$. As a result, the n-Si layer 4 is formed as deflecting electrodes 10 and 11, to complete the blanking aperture 1 according to the invention.

FIG. 3(I) is a top view showing the completed blanking aperture 1. Resistance films 12 and 13 are also formed on the n-Si layer 4. When the deflecting electrodes 10 and 11 are each driven with a positive potential, a pn junction between the p-type substrate 2 and the n-Si layer 4 is reversely biased, so that the n-Si layer 4 is insulated from the substrate 2, thereby providing the same effect as that provided by an insulation film.

This embodiment is advantageous because a silicon device fine processing technique is applicable, as it is for the embodiment. With a deflection voltage of 5 V or lower, the blanking aperture 1 can more stably deflect an electron beam passing therethrough, compared with the conventional blanking aperture.

Next, a second aspect of the invention will be explained.

According to the second aspect of the invention, a charged particle beam deflector comprises a semiconductor blanking aperture array 1 involving many blanking apertures 1'a, 1'b, and so on formed on a semiconductor substrate. Each of the blanking apertures has, for example, a square cross-sectional shape and an opening OP, and is provided with a deflecting electrode means including a deflecting electrode 11 and a grounding electrode 10. The deflecting electrode means protrudes from one main face of the semiconductor substrate, instead of being disposed in the opening OP.

Namely, the charged particle beam deflector according to the second aspect of the invention comprises the blanking aperture array of blanking apertures arranged in a predetermined shape for passing a charged particle beam; and the deflecting electrode means disposed close to the opening of each of the blanking apertures. The deflecting electrode means includes the deflecting electrode for deflecting the charged particle beam, and the grounding electrode. The charged particle beam is deflected by applying a predetermined voltage to the deflecting electrode means. The deflecting electrode means protrudes outward from the periphery of the blanking aperture, i.e., from one main face of the substrate on which the blanking aperture array is formed.

FIG. 4 shows an embodiment of the blanking aperture according to the second aspect of the invention.

In the figure, each of blanking apertures 1'a, 1'b, and so on has, for example, a square cross-sectional shape and an opening OP. A deflecting electrode 111 and a grounding electrode 110 are formed on one main face R of a semiconductor substrate 102 and protrudes from the periphery of the opening OP of each blanking aperture. The deflecting electrode 111 and grounding electrode 110 are arranged along two opposing sides H2 and H1, respectively, of the square opening OP. Insulation films 103 and lead conductors 114 and 115 are formed between the deflecting electrode 111 and grounding electrode 110 and the main face R of the semiconductor substrate 102.

The other two opposing sides where the deflecting electrode 111 and grounding electrode 110 do not exist, form spaces that maintain non-conductively because of the existence of vacuum.

An electric field is uniformly generated from the deflecting electrode 111 toward the grounding electrode 110. Electric fields generated in adjacent blanking apertures may interfere with each other to deflect more or less, lines of electric force formed between the adjacent deflecting electrode means. Most of the lines of electric force, however, are parallel and advance from the deflecting electrode 111 toward the grounding electrode 110 in each blanking aperture, to actually cause no interference with the electric fields.

The charged particle beam deflector of this embodiment is particularly useful when using a blanking aperture for generating a patterned beam.

The second aspect of the invention will be explained in more detail.

Figure 4A:
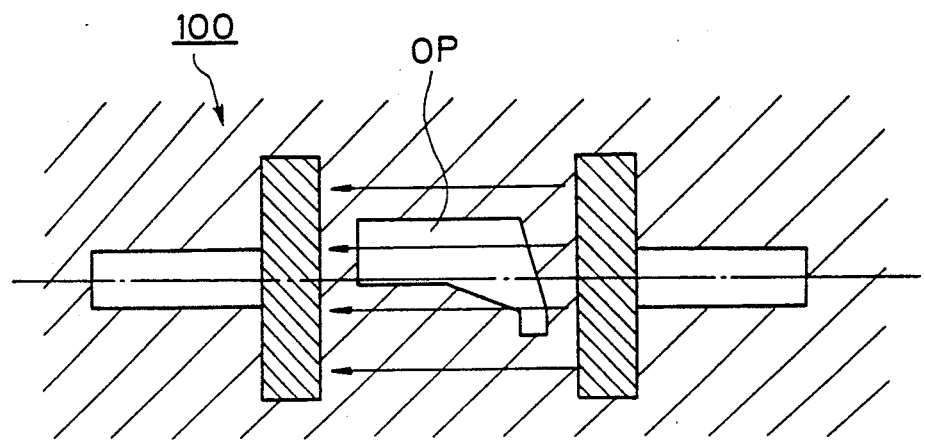
FIG. 4(A-B) are a view showing a second embodiment of the invention.
Figure 4B:
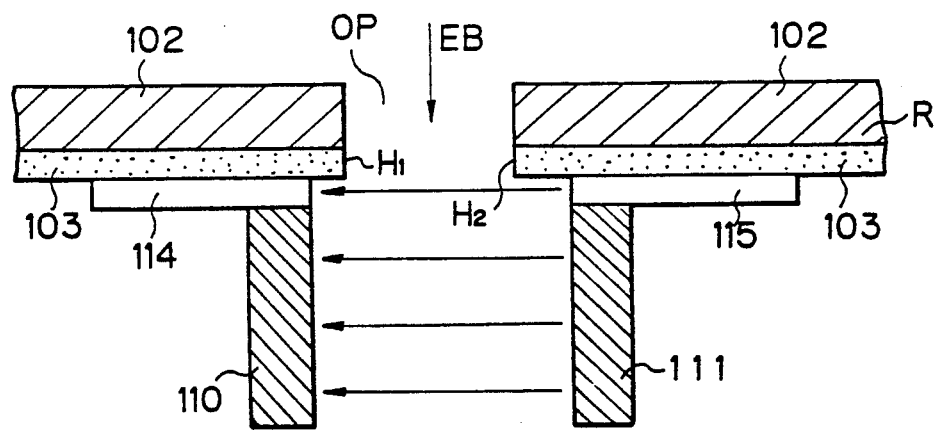
Figure 5A:
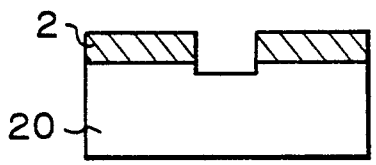
FIG. 5(A-I) are a view showing manufacturing processes of the embodiment of FIG. 4.
Figure 5B:
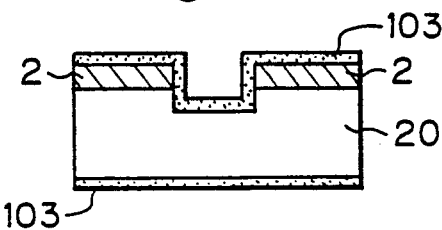
Figure 5C:
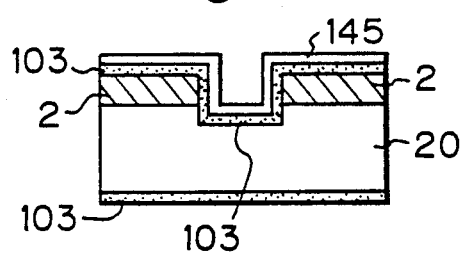
Figure 5D:
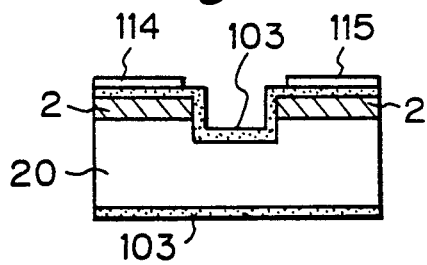
Figure 5E:
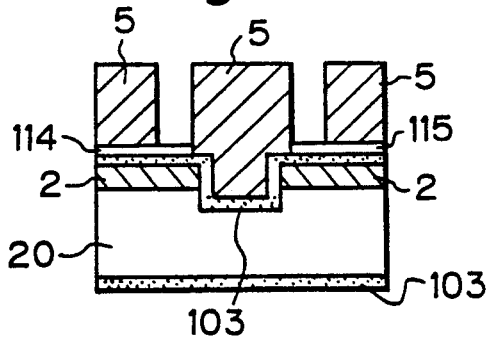
Figure 5F:
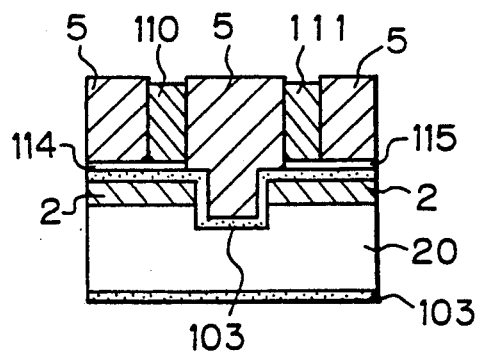
Figure 5G:
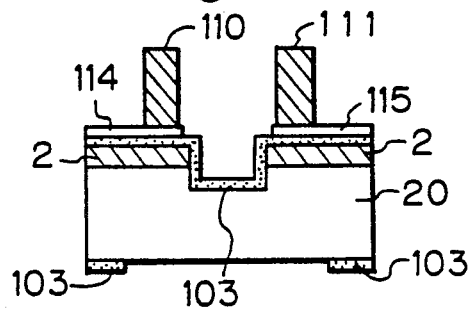
Figure 5H:
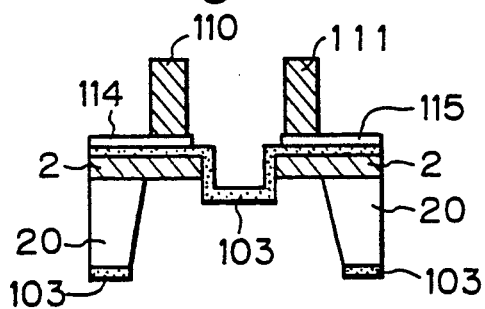
Figure 5I:
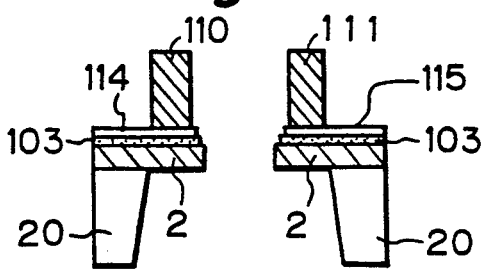
Figure 8A:
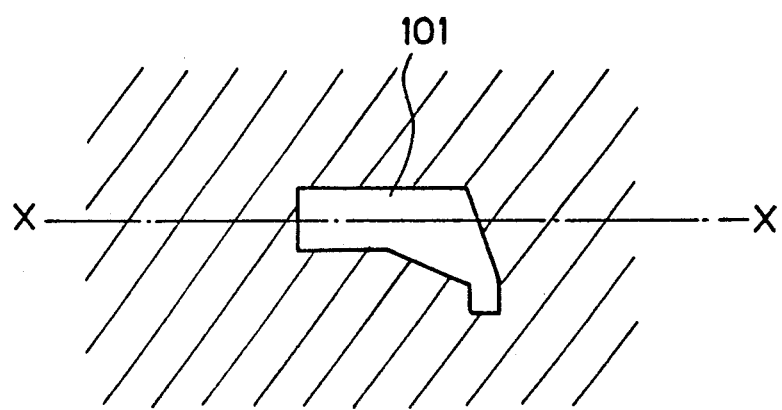
FIG. 8(A-B) are a view showing a blanking aperture for providing a patterned beam according to a prior art.
Figure 8B:
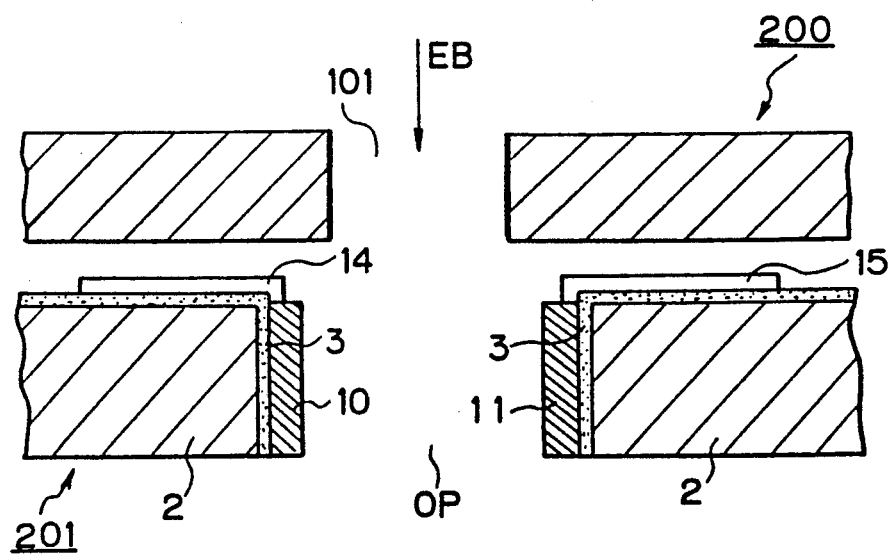

FIG. 4(A) is a bottom view showing the second embodiment, and FIG. 4(B) is a sectional view taken along a line X—X of FIG. 4(A). This embodiment is particularly effective for repeatedly drawing a relatively large pattern. These figures show a portion improved from the prior art of FIG. 8.

The conductive or semiconductive substrate 102 has the opening OP for forming a patterned beam. The insulation films 103 are formed over the substrate 102. The lead wires 114 and 115 are formed on opposite sides of the opening OP. The tall deflecting electrodes 110 and 111 are formed on the lead conductors 114 and 115, respectively, to complete the blanking aperture 100 of the invention. The opening OP and deflecting electrodes 110 and 111 are integrally formed on the same substrate 102. The shape of the opening OP may be the same as that of the embodiment of the first aspect of the invention.

FIGS. 5(A) to 5(I) are sectional views schematically showing examples of manufacturing processes of the second embodiment of the invention. The processes will be sequentially explained.

Process (1): An n-Si support substrate 20 having a surface orientation of <100> is prepared. A p-Si layer of about 15 μm thin is formed with B of $10^{20}$/cm$^3$ in concentration, thereby forming a substrate 2. An opening OP having a predetermined shape as shown in the figure is formed according to a photolithography technique using reactive ion etching.

Process (2): An insulation film 103, i.e., a thermal oxide (SiO$_2$) film of 500 nm thin is formed on each face of the substrate.

Process (3): A metal multilayer film 145 such as a 3-layer film of Au/Ti/Ta is formed on the opened side of the substrate, with the Au layer being the top layer.

Process (4): Lead wires 114 and 115 are patterned at opposite sides of the opening OP of the substrate according to a known photolithography technique.

Process (5): A resist pattern 5 of 30 to 40 μm in height is formed on the opened side of the substrate while leaving spots each of about 10 μm wide for deflecting electrodes 110 and 111.

Process (6): The surface of the Au layer of the metal multilayer film 145 exposed in the resist pattern 5 on the substrate is plated with, for example, Au to form metal strips to be the deflecting electrodes 110 and 111 each of, for example, 10 μm wide and 35 μm tall.

Process (7): The resist pattern 5 on the substrate is dissolved and removed with proper remover liquid, to expose the deflecting electrodes 110 and 111.

Process (8): The n-Si support substrate 20 is anisotropically etched from the reverse side thereof into a shape shown in the figure. This etching may be easily carried out with use of a mixture of liquids of, for example, ethylenediamine and pyrocatechol and water at 117° C. The high-concentration B diffusion layer substrate 2 is not substantially etched with the etching liquids and left.

Process (9): The SiO$_2$ film 103 remaining on the substrate is dissolved and removed with a HF water solution, to complete a blanking aperture 100 comprising the opening and deflecting electrodes formed on the same substrate 102 according to the second embodiment of the invention. This embodiment is advantageous because a silicon device fine processing technique is applicable to it as it is for the embodiment.

The embodiments mentioned above are only examples. Any materials, shapes, processing techniques, etc., may be properly selected and combined with one another without departing from the scope of the invention.

According to the embodiments of the invention mentioned above, the resistance films 12 and 13 are formed along opposing inner walls of the blanking aperture 1 where the deflecting electrodes 10 and 11 do not exist. The resistance films 12 and 13 are connected to sides of the deflecting electrodes 10 and 11. This arrangement provides a uniform potential gradation due to a voltage drop caused by currents flowing through the resistance films 10 and 11 along the side walls. As a result, lines of electric force generated in the aperture will substantially be parallel with one another to provide a uniform electric field. As a result, a beam passing through the aperture is deflected as required even with a low deflection voltage.

In the blanking aperture for generating a patterned beam according to the invention, the opening OP and deflecting electrodes 110 and 111 are formed on the same substrate 102, so that it is not necessary to axially align and assemble two elements before use. This simplifies the deflecting operation and improves productivity.

There is an increasing necessity for densely integrating a large number of blanking apertures in an array and simultaneously controling the blanking apertures to improve the speed and efficiency of an exposure operation using a charged particle beam. As the blanking apertures are more integrated, the problems explained with reference to the prior arts arise.

One of the problems is the interference between electric fields produced in adjacent blanking apertures.

To improve the speed and efficiency of the exposure process with use of an array of densely integrated blanking apertures, the invention solves the problem of interference and curving of lines of electric force produced between deflecting electrodes.

A third aspect of the invention for solving the problems will be explained.

Figure 6:
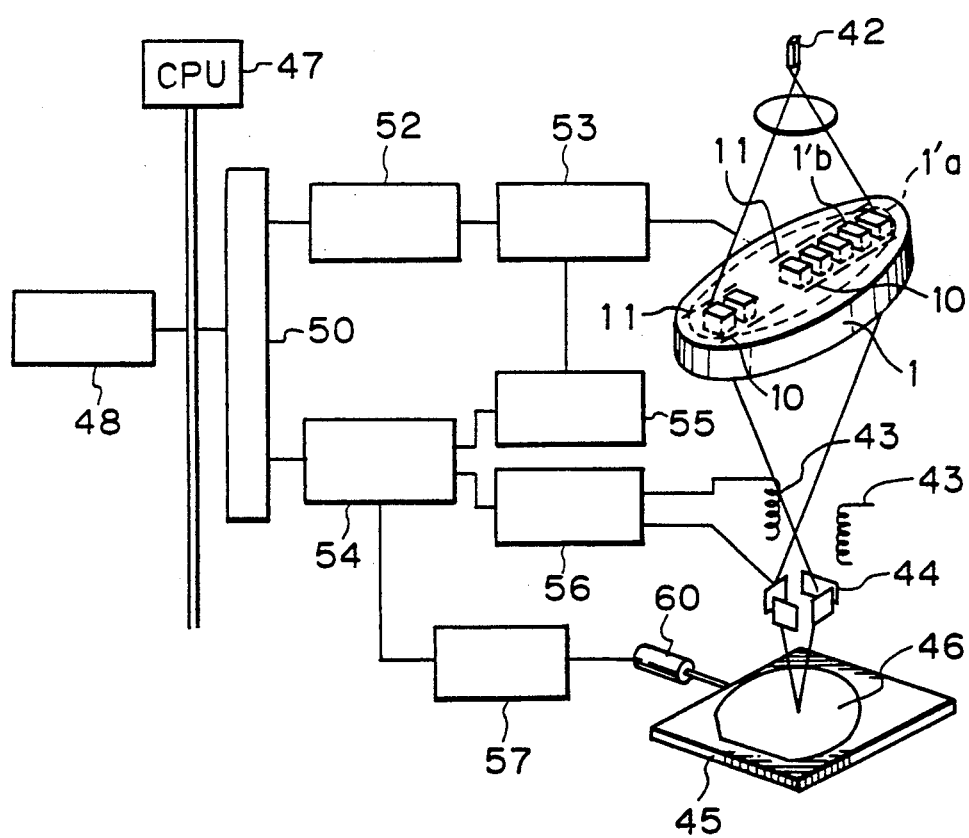
FIG. 6 is a view showing an arrangement of a charged particle beam deflector.
Figure 7A:
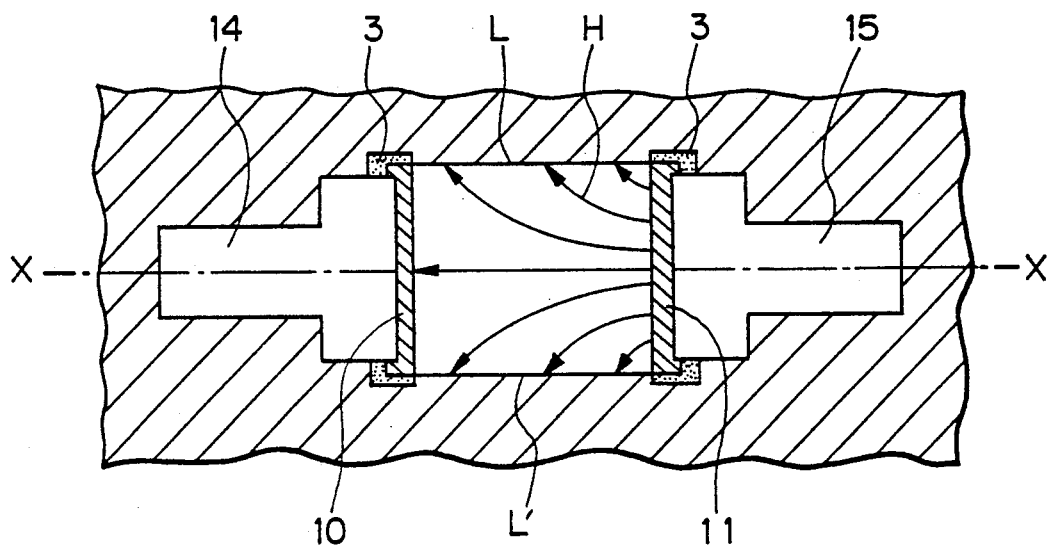
FIG. 7(A-B) are a view showing a blanking aperture according to a prior art.
Figure 7B:
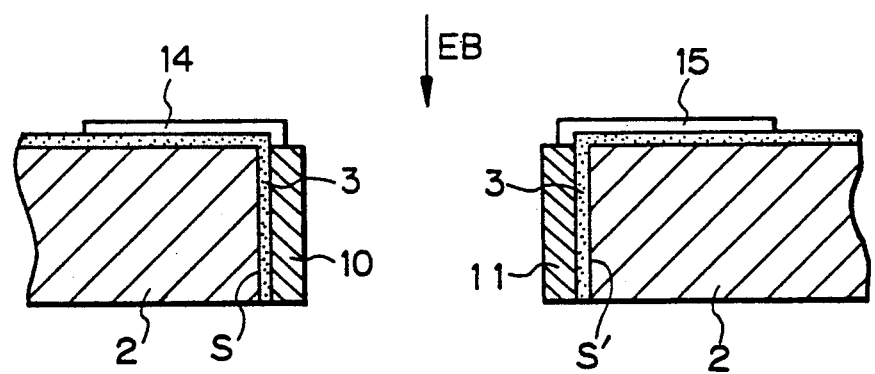

FIG. 9 is a plan view showing a wafer exposure method for the charged particle beam deflector of FIG. 6 using a line beam. FIG. 9 also shows a time chart of applied deflection voltages.

The apertures 1'a, 1'b, and so on of the blanking aperture array 1 are arranged above the wafer 46. The deflecting electrode 11 and grounding electrode 10 are disposed on opposite sides of each of the apertures 1'a, 1'b, and so on. The electrodes are arranged at intervals each corresponding to an effective beam scan width W.

Electron beam components are passed through the apertures 1'a, 1'b, and so on, respectively, and deflection voltages are applied to required deflecting electrodes 11 and grounding electrodes 10 to deflect the electron beam components toward the deflecting electrodes 11.

When voltages are applied to the first to third deflecting and grounding electrodes 11 and 10 at timing (a) in FIG. 9, the electron beam components passing through the corresponding apertures are deflected to positions corresponding to the applied voltages.

Similarly, when a deflection voltage is applied to the fourth electrodes 11 and 10 at timing (b), the corresponding electron beam is deflected accordingly.

Thereafter, deflection voltages are applied to the fifth and sixth electrodes 11 and 10 at timing (c). As a result, the electron beam components are shot to expose spots 100 on a resist of the wafer 46.

By turning on and off the voltages applied to pairs of the electrodes 11 and 10 of the apertures 1'a, 1'b, and so on, the electron beam passing through the blanking aperture array is controlled and deflected. Combining this control with movements of the wafer 46, optional patterns may be drawn on the wafer 46.

Figure 10:
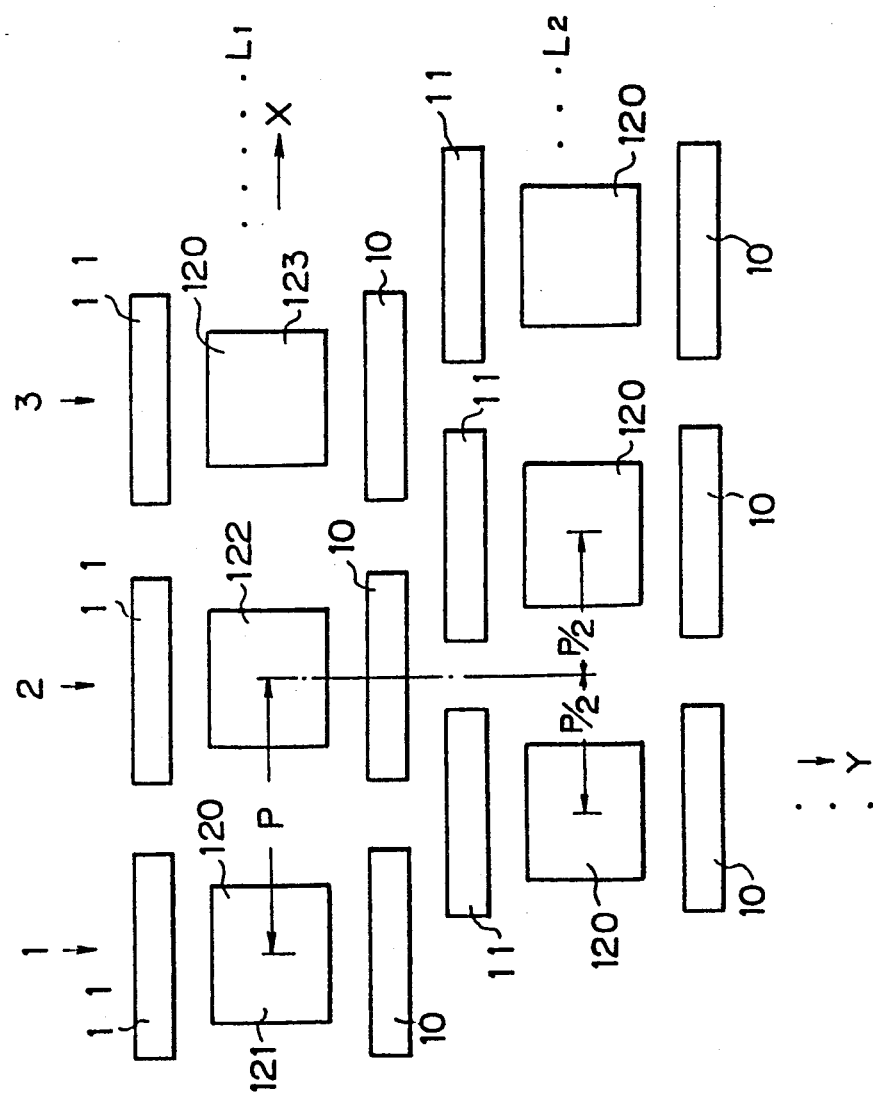
FIG. 10 is a plan view showing lines of blanking aperture arrays according to a prior art.

FIG. 10 is a plan view showing lines of blanking aperture arrays. Apertures 120 are arranged in two lines L1 and L2. It is possible to arrange the apertures in three or more lines. A deflecting electrode 11 and a grounding electrode 10 are disposed on opposite sides of each of the apertures 120. The grounding electrodes 10 are electrically connected to one another and grounded.

When the apertures are arranged in a single line as in FIG. 6, an interval between adjacent apertures will be an exposure impossible region. When the apertures are arranged in a zigzag manner in two lines L1 and L2 shifted by ½ pitches from each other as shown in FIG. 10, the exposure impossible regions may be minimized.

Electron beam components passing through the apertures of FIG. 10 are independently controlled and deflected.

The arrangement of FIG. 10, however, causes an interference between electron beam components passing through adjacent apertures 120. In addition, this arrangement does not effectively use an electron beam because the area of each aperture 120 is small.

Figure 11:
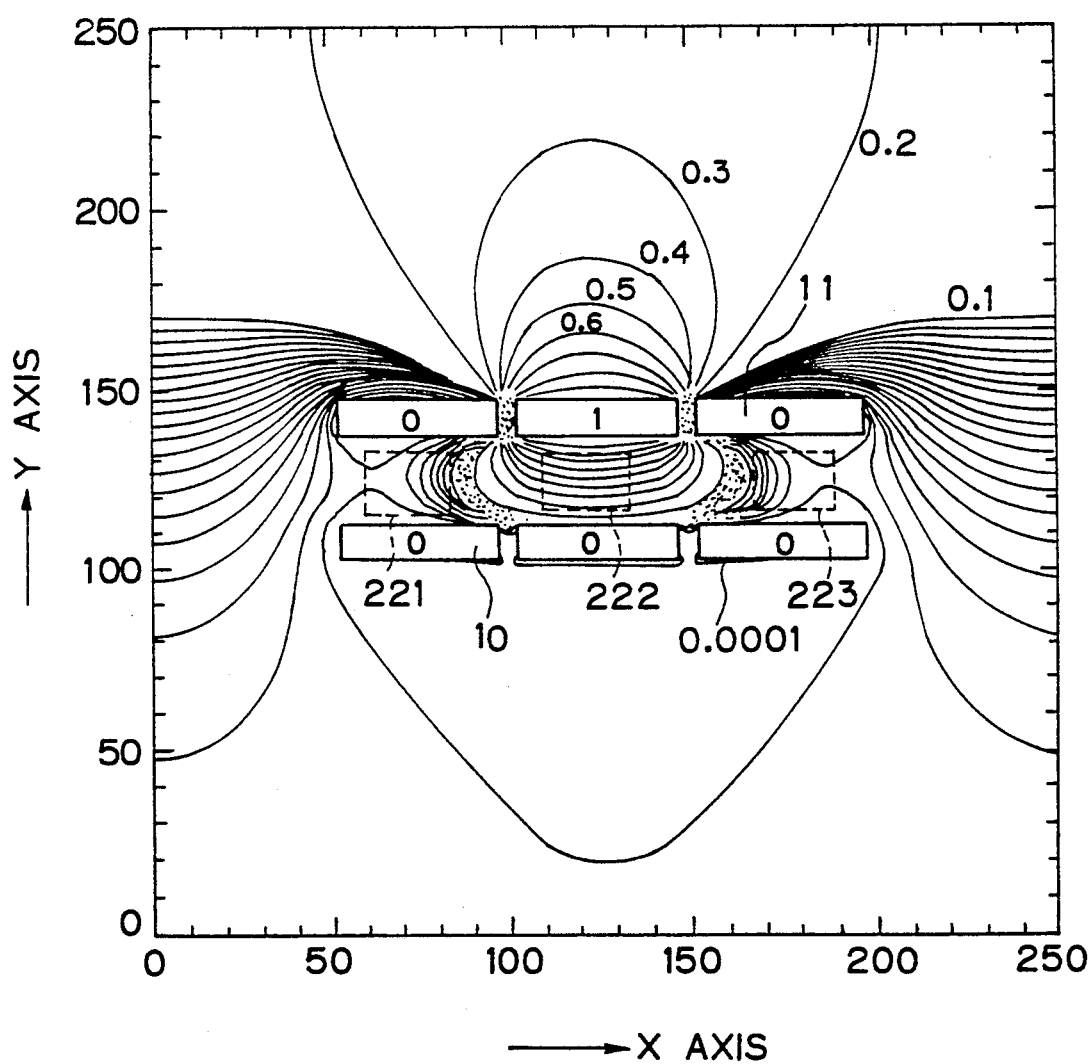
FIG. 11 is a graph showing a result of a computer simulation carried out on a leaking electric field of a blanking aperture array according to a prior art having no shielding electrodes.

If a deflection voltage is applied to the electrodes 11 and 10 of the second aperture 122 while no voltage is applied to the electrodes 11 and 10 of the adjacent first and third apertures 121 and 123, an electric field produced between the electrodes 11 and 10 of the second aperture 122 leaks toward the adjacent inactive apertures 121 and 123 as shown in FIG. 11. As a result, electron beam components passing through the apertures 121 and 123 are deflected due to the electric field produced in the second aperture 122. In this way, the leaking electric field from the adjacent active aperture deteriorates the accuracy of electron beam deflection.

Regions of the blanking aperture array except for the regions of the apertures 120 block electron beam components, which are, therefore, wasted. In FIG. 10, the deflecting electrode 11 and grounding electrode 10 are arranged on opposite sides of each of the apertures 120 in each of the aperture lines L1 and L2. This arrangement reduces the regions of the apertures 120 in the blanking aperture array, thereby wasting electron beam components and exposure areas and elongating an exposure time.

The present invention intends to eliminate an influence of a leaking electric field on adjacent apertures and increase an area of each aperture in a blanking aperture array.

Figure 12:
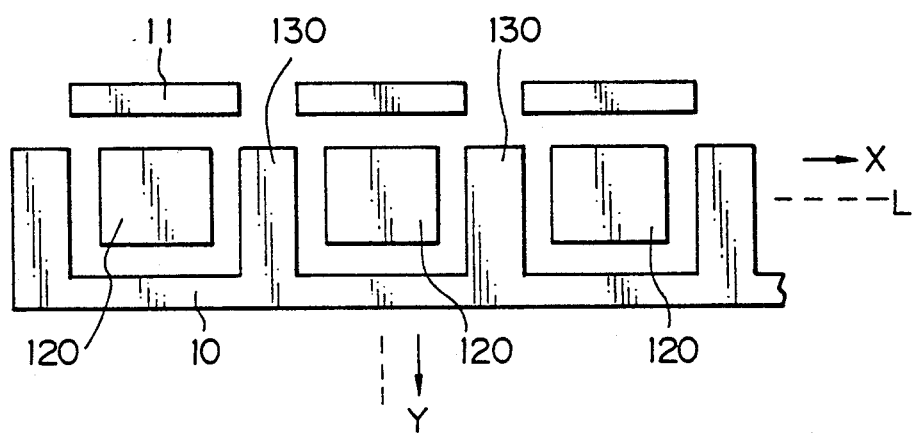
FIG. 12 is a plan view showing a charged particle beam deflector according to a third aspect of the invention.

To achieve this, FIG. 12 is a plan view showing a principle of a charged electron beam deflector according to a third aspect of the invention.

The charged particle beam deflector of the invention comprises lines of apertures 120 for passing components of a charged particle beam. A deflecting electrode 11 and a grounding electrode 10 are arranged on opposite sides of each aperture 120, for deflecting a charged particle beam component. A shielding electrode 130 connected to the grounding electrodes is arranged between adjacent apertures 120 in each aperture line L.

Figure 13:
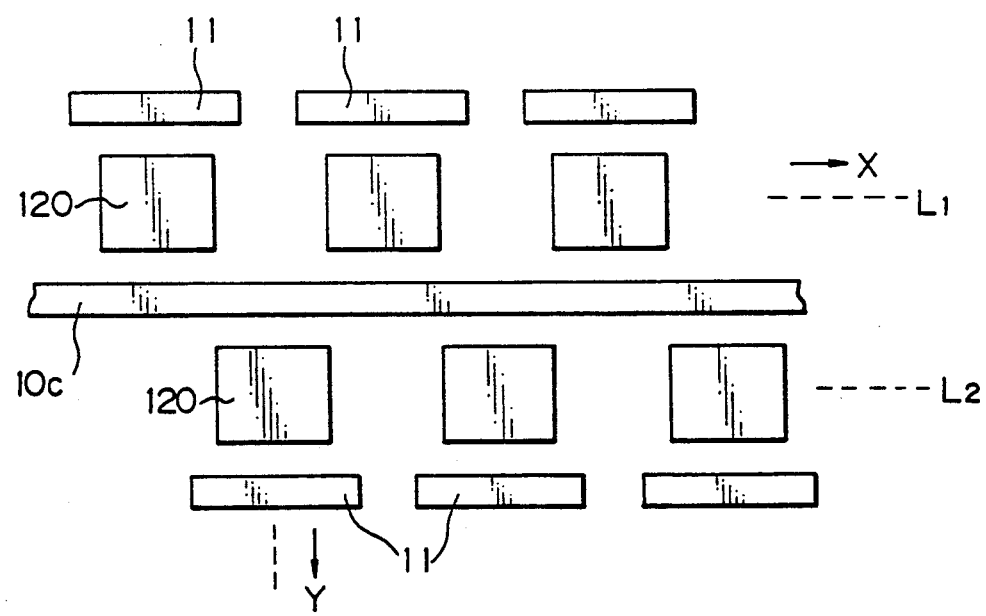
FIG. 13 is a plan view showing an embodiment of the third aspect of the invention.

FIG. 13 shows another embodiment according to the third aspect of the invention. In the figure, a common grounding electrode 10c is arranged between and shared by adjacent aperture lines L1 and L2.

Figure 14:
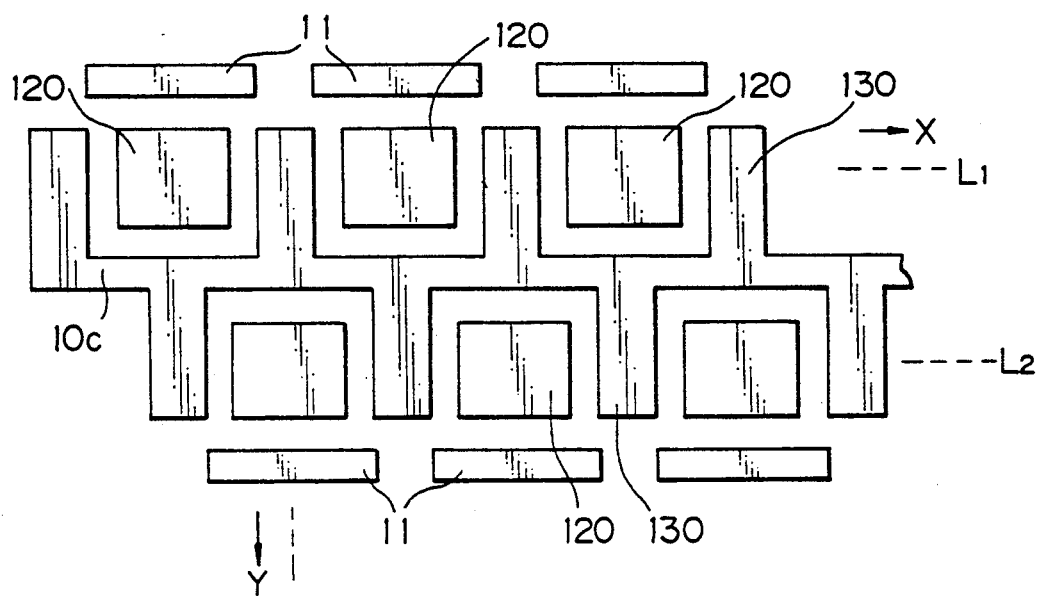
FIG. 14 is a plan view showing another embodiment of the third aspect of the invention.

FIG. 14 shows still another embodiment according to the third aspect of the invention. In the figure, a common grounding electrode 10c is arranged between and shared by adjacent aperture lines L1 and L2. In addition, a shielding electrode 130 connected to the common grounding electrode 10c is arranged between adjacent apertures 120 in each of the aperture lines L1 and L2. The shielding electrode 130 blocks an electric field generated in one aperture 120 from leaking into the next aperture 120. As a result, a charged particle beam component passing through the next aperture 120 is not deflected by the leaking electric field. Namely, charged particle beam components passing through the adjacent apertures 120 do not interfere with each other and are independently and precisely controlled in each aperture 120.

When the grounding electrode 10c is disposed between and shared by the adjacent aperture lines L1 and L2, the single common grounding electrode 10c is sufficient for the adjacent two aperture lines L1 and L2, so that a distance between the aperture lines L1 and L2 may be reduced. This saves a space occupied by the grounding electrode and expands the area of each aperture.

In addition to arranging the grounding electrode 10c shared by the adjacent aperture lines L1 and L2, for reducing the space occupied by the grounding electrode and expanding the aperture area, the shielding electrode 130 may be disposed between adjacent apertures 120 in each of the aperture lines L1 and L2 and connected to the common grounding electrode 10c, for preventing an electric field generated in one aperture from leaking into the next aperture.

Figure 15:
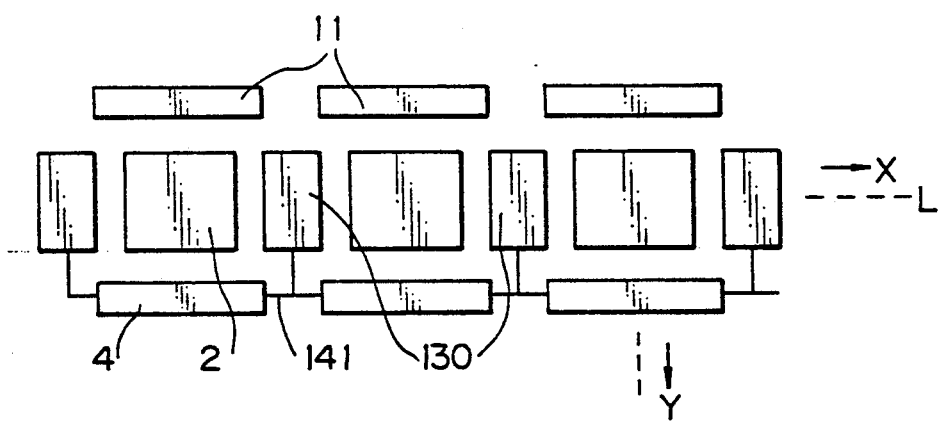
FIG. 15 is a plan view showing still another embodiment of the invention.

FIG. 15 is a plan view showing still another embodiment of the invention. In the embodiments shown in FIGS. 12 to 14, the grounding electrode 10 or 10c is a continuous single electrode on the surface of the blanking aperture array. On the other hand, the embodiment shown in FIG. 15 connects independent grounding electrodes 10 to each other through wiring patterns 141. The wiring patterns 141 may be arranged on the surface of the blanking aperture array, or inside the blanking aperture array and connected to the grounding electrodes 10 through through-holes. The grounding electrodes 10 may also be connected to shielding electrodes 130 through the wiring patterns 141.

Figure 16:
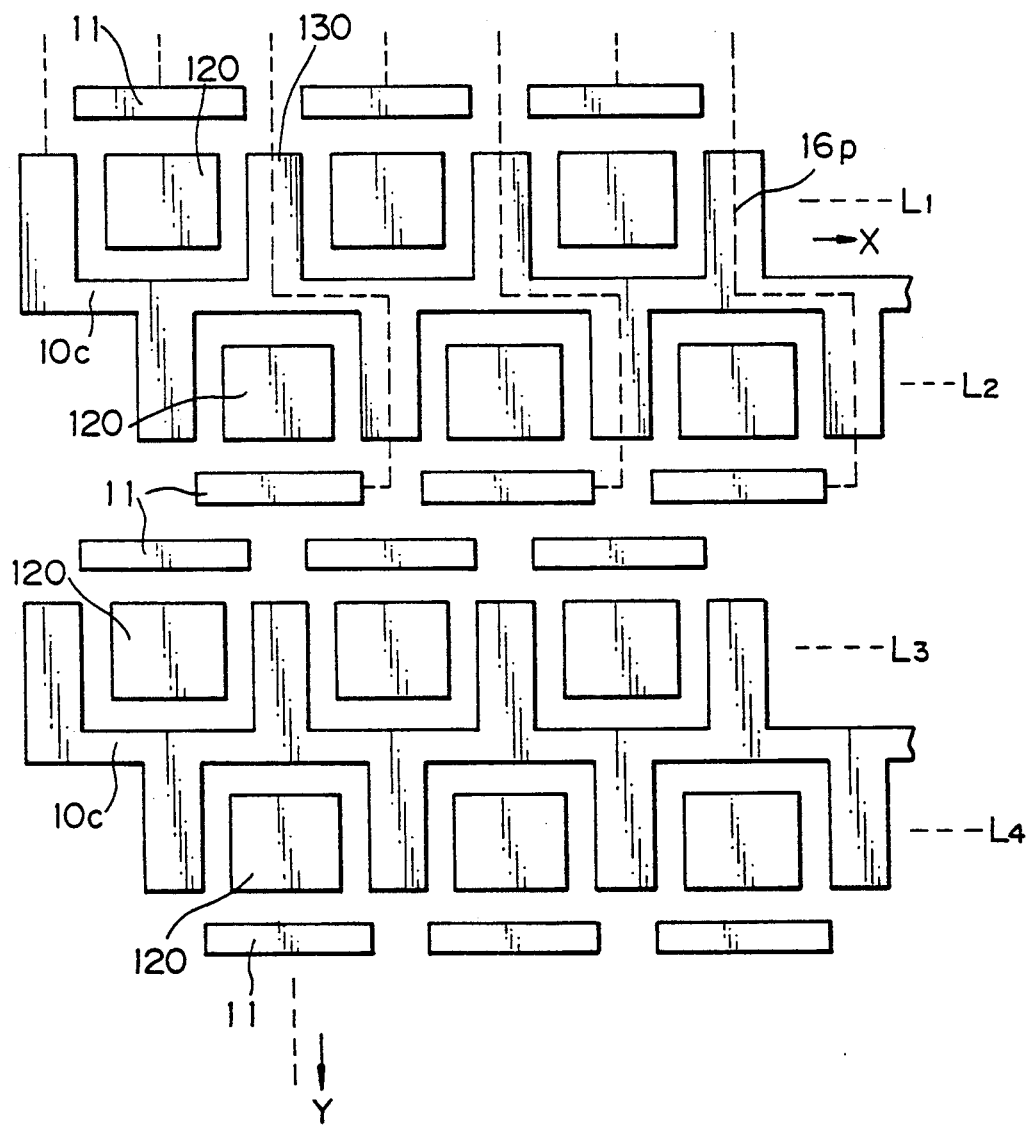
FIG. 16 is a plan view showing still another embodiment of the invention.

FIG. 16 is a plan view showing still another embodiment of the invention. A common grounding electrode 10c is disposed between a pair of aperture lines L1 and L2, and a plurality of the aperture line pairs are arranged in a direction Y orthogonal to the lines extending in a direction X. The aperture lines are selectively used to more efficiently deflect charged particle beam components. Conductor patterns 16p indicated with dotted lines lead electrodes 11 and 10c to terminals of a blanking aperture array.

FIGS. 17(A) to 17(L) are sectional views showing examples of manufacturing processes of a blanking aperture array according to the invention. The processes will be sequentially explained.

Process (1): A conductive silicon substrate 212 is prepared. A high-concentration boron diffusion layer 213 is formed on the silicon substrate 212.

Process (2): An opening 214 is formed on the surface of the substrate according to a trench etching technique.

Process (3): $SiO_2$ films 215 are formed over the inner walls of the opening 14 and on both faces of the substrate according to a thermal oxidation technique.

Process (4): A conductor film 216 for wiring is formed on the $SiO_2$ film 215.

Process (5): The conductor film 216 is patterned into conductor patterns 16p.

Process (6): A thick-film resist pattern 217 having through holes 218 for plating is formed.

Process (7): With the thick-film resist pattern 217 as a mask, an electrode metal is plated to form a plated base 219.

Process (8): The $SiO_2$ film 215 formed in the process (3) on the reverse side of the substrate is patterned.

Process (9): The patterned $SiO_2$ film 15p is used as a mask to etch the back of the silicon substrate 212 with ethylenediamine, pyrocatechol water solution, etc. The etching is stopped at the high-concentration boron diffusion layer 213 to expose the bottom of the opening 214. A resist 221 having openings 220 is formed on the surface of the substrate.

Process (10): Metal is plated.

Process (11): The resist 221 and plating base 219 are removed.

Process (12): The oxide film 215 in the opening 214 is removed with hydrofluoric acid, to complete the blanking aperture.

In this way, the deflecting electrodes 11, common grounding electrodes 10c, and shielding electrodes 130 2 each having a height of 30 μm or over are easily formed by plating.

Figure 17:
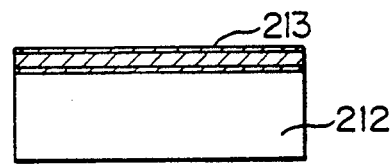
FIG. 17(A-L) are a view showing manufacturing processes of a blanking aperture according to the invention.
Figure 17:
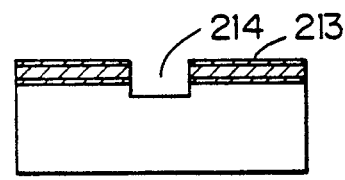
Figure 17:
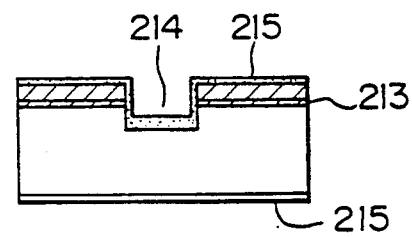
Figure 17:
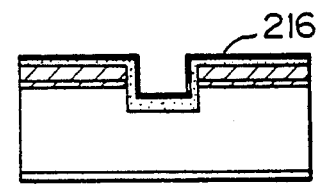
Figure 17:
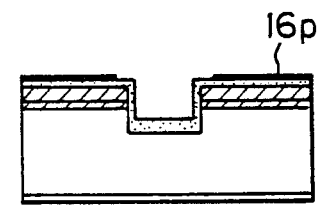
Figure 17:
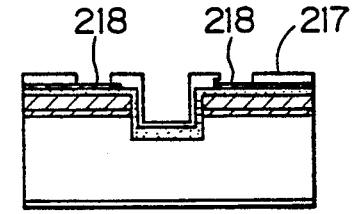
Figure 17:
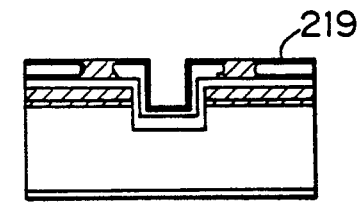
Figure 17H:
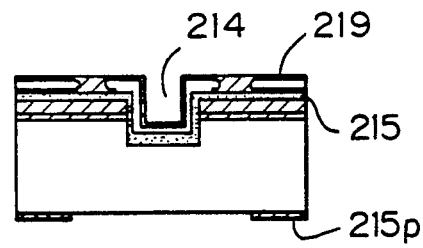
Figure 17I:
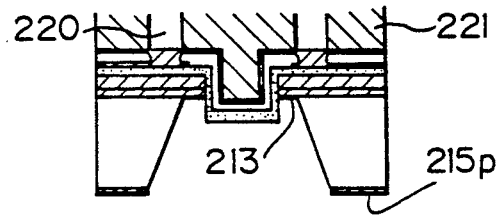
Figure 17J:
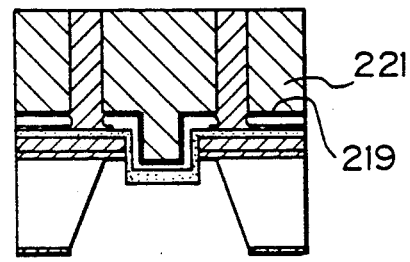
Figure 17K:
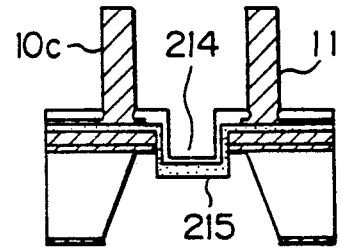
Figure 17L:
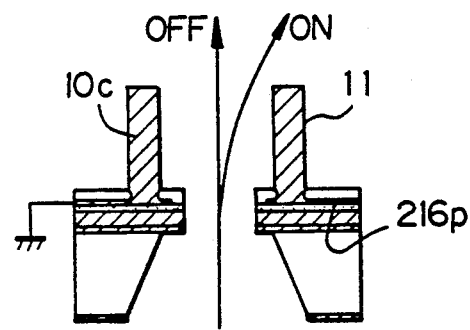

When no voltage is applied between the grounding electrode 10c and the deflection electrode 11, a charged particle beam advances straight, and when a voltage is applied to the electrodes, the beam is deflected, as shown in FIG. 17(L).

If a charged particle beam hits the electrodes 11 and 10c, the electrodes will be damaged. To avoid this, the electrodes 11 and 10c are oriented toward a wafer. The blanking aperture arrays of FIGS. 12 to 16, therefore, are arranged such that their electrodes 11, 10, 10c, and 130 face wafers.

Figure 18:
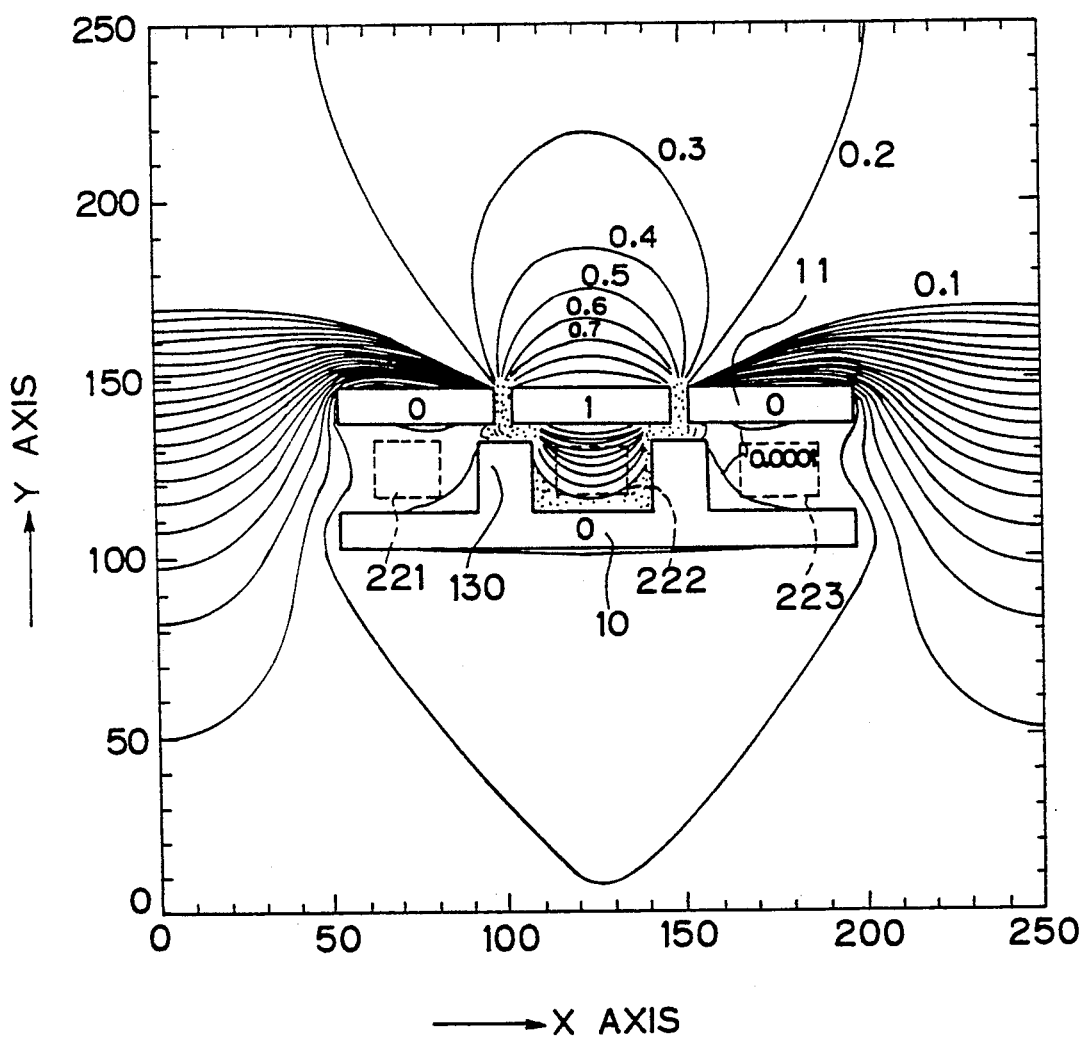
FIG. 18 is a graph showing a result of a computer simulation carried out on a leaking electric field of a blanking aperture array according to the invention having shielding electrodes.

FIGS. 11 and 18 are views showing results of computer simulations of leaking electric fields with and without the shielding electrodes 130 between adjacent apertures.

FIG. 11 shows the conventional blanking aperture array (for example, FIG. 10) having no shielding electrodes. When a deflection voltage is applied between electrodes 11 and 10 of a central aperture 222, adjacent apertures 221 and 223 each receive about 1% of a leaking electric field.

FIG. 18 shows the blanking aperture array of the invention (FIG. 12) having the shielding electrodes 130, deflecting electrodes 11, and grounding electrodes 10 formed according to the processes of FIGS. 17(A) to 17(L). A leaking electric field to adjacent apertures 221 and 223 from a central aperture 222 is less than 0.01%. In this way, the shielding electrodes 130 disposed between adjacent apertures is very effective in blocking leaking electric fields.

The embodiments according to the third aspect of the invention form the deflecting electrode means on the outside of a principal plane of a substrate, similar to the second aspect of the invention. This arrangement forms side spaces between the electrodes 11 and 10. According to the third aspect of the invention, the side spaces are partly closed by the shielding electrodes 130, and the remaining open parts of the side spaces effectively prevent lines of electric force from curving.

As explained above, the invention arranges deflecting electrodes 10 and 11 on opposite sides of each blanking aperture 1, and resistance films 12 and 13 on the other opposite sides of the aperture where the deflecting electrodes 10 and 11 do not exist. The resistance films 12 and 13 are connected to ends of the deflecting electrodes 10 and 11. Currents flowing through the resistance films 10 and 11 cause a voltage drop, which provides a uniform potential gradation. Accordingly, lines of electric force inside the aperture are substantially parallel with one another to provide a uniform electric field in which a beam is deflected as required, even with a low deflection voltage.

The invention also provides a charged particle beam deflector having blanking apertures 100 for producing a patterned beam. The blanking aperture 100 involves an opening 101 and deflecting electrodes 110 and 111 that are integrally formed on a single substrate 102. These elements are not required to be axially aligned and assembled before use, thereby improving the operability, productivity, and performance of the deflector, and reducing deflection voltages.

The invention arranges a shielding electrode 130 between adjacent apertures 120 in each aperture line L of a blanking aperture array. Each shielding electrode 130 is connected to a grounding electrode 10 and blocks an electric field leaking from a deflecting electrode 11 to an adjacent aperture. As a result, each aperture can independently and precisely control a beam component.

The invention arranges a common grounding electrode 10c shared by adjacent aperture lines L1 and L2, to reduce a distance between the adjacent aperture lines L1 and L2, thereby expanding an area of each aperture to efficiently use a charged particle beam.

In addition to the common grounding electrode 10c shared by the adjacent aperture lines L1 and L2, the invention may arrange a shielding electrode 130 between adjacent apertures in each of the aperture lines and connect the shielding electrode 130 to the common grounding electrode 10c. This arrangement expands the area of each aperture and prevents an electric field from leaking into an adjacent aperture.

Figure 19:
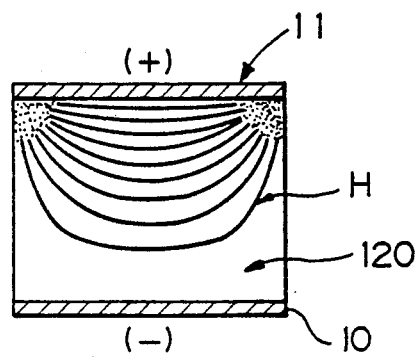
FIGS. 19(A) and 19(B) show comparative configurations of lines of electric force formed and crossing the aperture when a predetermined electric voltage is applied between electrodes.
Figure 19:
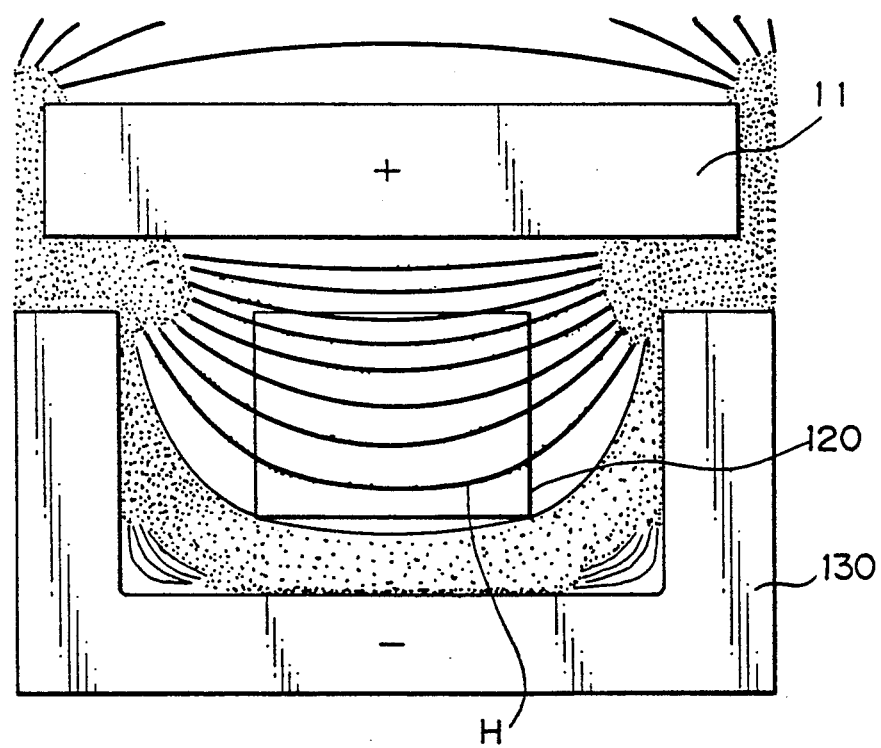

FIGS. 19(A) and 19(B) show comparative configurations of lines of electric force formed and crossing the aperture when a predetermined electric voltage is applied between electrodes.

FIG. 19(A) shows configuration of lines of electric force H formed and crossing the aperture when a predetermined electric voltage is applied between electrodes 11 and 10 in a conventional charged particle beam deflector and 19(B) shows a comparative configuration of the same when a predetermined electric voltage is applied between electrodes in a charged particle beam deflector of the present invention as shown in FIG. 14.

As apparent from these comparative configurations, in the conventional deflector, the lines of electric force H formed and crossing the aperture is curved and deformed, while in the present invention, due to the existence of shielding electrode 130, the lines of electric force H are relatively parallel to each other and thereby configuration of the lines of electric force H can be improved in comparison with the conventional deflector.

I claim:

1. A charged particle beam deflector comprising:
a plurality of blanking apertures each for passing a component of a charged particle beam, arranged into a blanking aperture array having a predetermined shape;
a deflecting electrode means disposed close to each of the blanking apertures, having a deflecting electrode for deflecting the charged particle beam component passing through the aperture and a grounding electrode, the charged particle beam component being deflected by applying a predetermined voltage to the deflecting electrode means, the deflecting and grounding electrodes being opposite and disposed apart from each other by a distance corresponding to the length of the aperture; and
a nonconductive member arranged at least partly in each side space formed between the opposing deflecting and grounding electrodes.

2. A charged particle beam deflector according to claim 1, wherein the deflecting electrode means is disposed on opposing inner walls of each of the blanking apertures.

3. A charged particle beam deflector according to claim 2, wherein the blanking aperture array is formed on a semiconductor substrate, and resistance members are arranged at least on a pair of opposing inner walls where the deflecting electrode means does not exist, in each of the apertures.

4. A charged particle beam deflector according to claim 2, wherein the blanking aperture array is formed on a semiconductor substrate, and insulators are arranged at least on a pair of opposing inner walls where the deflecting electrode means does not exist, in each of the apertures.

5. A charged particle beam deflector according to claim 2, wherein insulators are arranged on the inner walls where the deflecting electrode means is arranged, in each of the apertures.

6. A charged particle beam deflector according to claim 2, wherein the blanking aperture array is formed on a semiconductor substrate, and at least inner walls of each of the apertures are made from a semiconductor layer of a conduction type different from that of the semiconductor substrate.

7. A charged particle beam deflector according to claim 1, wherein the deflecting electrode means protrudes outward from the periphery of the blanking aperture, i.e., from one principal plane of a substrate on which the blanking aperture array is formed.

8. A charged particle beam deflector according to claim 7, wherein the deflecting electrode means protrudes outward from the vicinities of the two opposing sides of the blanking aperture.

9. A charged particle beam deflector according to claim 7, wherein side spaces defined by the opposing deflecting and grounding electrodes of the deflecting electrode means are filled with air or in vacuum condition.

10. A charged particle beam deflector according to claim 1, wherein the nonconductive member arranged at least partly in each side space formed between the opposing deflecting and grounding electrodes of the deflecting electrode means is made from a nonconductive material selected among insulator materials, resistance materials, and semiconductors.

11. A charged particle beam deflector according to claim 1, wherein the blanking aperture array includes a plurality of aperture lines each including a plurality of the blanking apertures.

12. A charged particle beam deflector according to claim 11, wherein the deflecting electrode means protrudes outward from the vicinities of the two opposing sides of the blanking aperture.

13. A charged particle beam deflector according to claim 12, wherein a shielding electrode is disposed between adjacent apertures and oriented orthogonal to the parallel aperture lines.

14. A charged particle beam deflector according to claim 9, wherein the deflecting electrodes are arranged close to the apertures and opposite the continuous grounding electrode.

15. A charged particle beam deflector according to claim 1, wherein the deflecting electrode means is formed above and connected to lead wires formed on a pair of opposing sides of each of the blanking apertures.

16. A method for exposing a charged particle beam to an object utilizing a charged particle beam deflector comprising a plurality of blanking apertures, each for passing a component of a charged particle beam, arranged into a blanking aperture array having a predetermined shape, a deflecting electrode means disposed close to each of the blanking apertures, having a deflecting electrode for deflecting the charged particle beam component passing through the aperture and a grounding electrode, the charged particle beam component being deflected by applying a predetermined voltage to the deflecting electrode means, the deflecting and grounding electrodes being opposite and disposed apart from each other by a distance corresponding to the length of the aperture, wherein said charged particle beam is exposed to said object so that a level of deflection of lines of electric force formed across said aperture is reduced.

17. A method for exposing a charged particle beam to an object according to claim 16, wherein said deflection preventing operation is carried out by providing at least a nonconductive member partly at least in each side space formed between the opposing deflecting and grounding electrodes.

18. A method for exposing a charged particle beam to an object according to claim 16, wherein said electric deflecting force lines preventing an operation is carried out by providing and projecting said electrodes on a surface of the substrate and in a vicinity of said apertures.

19. A method for exposing a charged particle beam to an object according to claim 18, wherein a shield electrode is further provided to said electrodes.

* * * * *